United States Patent [19]

Suzuki et al.

[11] 4,326,215
[45] Apr. 20, 1982

[54] ENCAPSULATED SEMICONDUCTOR DEVICE WITH A METALLIC BASE PLATE

[75] Inventors: Hiromichi Suzuki, Tokyo; Susumu Okikawa, Ohme, both of Japan

[73] Assignee: Hitachi, Ltd., Tokyo, Japan

[21] Appl. No.: 96,387

[22] Filed: Nov. 21, 1979

[30] Foreign Application Priority Data

Feb. 23, 1979 [JP] Japan ................... 54-19830

[51] Int. Cl.$^3$ ............. H01L 23/02; H01L 23/28; H01L 23/48
[52] U.S. Cl. .............................. 357/81; 357/72; 357/65; 357/68
[58] Field of Search .................. 357/65, 68, 72, 81

[56] References Cited

U.S. PATENT DOCUMENTS

| | | | |
|---|---|---|---|
| 3,423,516 | 1/1969 | Segerson | 357/72 |
| 3,679,946 | 7/1972 | Buck et al. | 357/72 |
| 3,729,573 | 4/1973 | Dunn | 357/72 |
| 3,751,724 | 8/1973 | McGrath et al. | 357/72 |
| 3,786,317 | 1/1974 | Thierfelder | 357/72 |
| 3,836,825 | 9/1974 | Hall et al. | 357/81 |
| 4,048,670 | 9/1977 | Eysermans | 357/72 |
| 4,107,727 | 8/1978 | Ikezawa et al. | 357/72 |
| 4,125,740 | 11/1978 | Paletto | 357/72 |
| 4,132,856 | 1/1979 | Hutchison | 357/72 |

FOREIGN PATENT DOCUMENTS

| | | | |
|---|---|---|---|
| 2818080 | 11/1978 | Fed. Rep. of Germany | 357/72 |
| 52-53665 | 4/1977 | Japan | 357/72 |
| 1158529 | 7/1969 | United Kingdom | 357/72 |

Primary Examiner—Andrew J. James
Attorney, Agent, or Firm—Craig and Antonelli

[57] ABSTRACT

A semiconductor device comprising a metallic base plate whose side surfaces are formed with cut-away portions having circular arc-shaped parts, a semiconductor element which is connected to the surface of the metallic base plate, and a resin which lies in contact with the cut-away portions and which seals the semiconductor element.

7 Claims, 8 Drawing Figures

ENCAPSULATED SEMICONDUCTOR DEVICE WITH A METALLIC BASE PLATE

BACKGROUND OF THE INVENTION

This invention relates to a resin-molded semiconductor device, and more particularly to improvements for preventing the concentration of stresses on the plastic package of the semiconductor device.

As a packaging structure for resin-molded semiconductor devices, especially power transistors and power ICs, the inventors of the present invention have proposed a structure as shown in FIGS. 1 and 2 wherein a semiconductor element (chip) 2 is mounted on the surface of a heat radiating base plate (header) 1 made of an electric conductor such as copper and is sealed by a plastic package 3 of an epoxy resin or the like in a manner to be encapsulated therein (for the sake of clarity, leads etc. are omitted in FIGS. 1 and 2). The heat radiating base plate 1 has a screw mounting portion (external connection portion) 4 which serves to bring the semiconductor device into touch with an external base plate (external heat sink) of a metal or the like, and which is exposed outside the plastic package 3. The mounting portion 4 has screw holes 5. The lateral width $X_1$ of this portion 4 is greater than the lateral width $X_2$ of a mounting portion 14 for the semiconductor element (chip) 2. The rear surface of the semiconductor element-mounting portion 14 is exposed outside the plastic package 3. Stepped out-away portion 6 are formed between the screw mounting portion 4 and the semiconductor element-mounting portion 14. The plastic package 3 for encapsulating the semiconductor element 2 therein seals the element in contact with the side surfaces of the cut-away portions 6. According to the structure as described above, the element mounting portion 14 of the metallic base plate 1 to be sealed in the plastic package 3 is smaller in width than the plastic package 3, and hence, the amount of warp of the plastic package 3 ascribable to the difference of the coefficients of thermal expansion of the metallic base plate 1 and the plastic package 3 can be made small during the resin-molding. In addition, since the external connection portion 4 has the width greater than that of the element mounting portion 14, the semiconductor device can be rigidly attached to the package mounting base plate or heat sink and also good characteristics of heat radiation can be attained.

The inventors of the present invention, however, have found that a disadvantage to be described hereunder is involved in the resin-molded semiconductor device of the above structure. That is, in a case where the radiating base plate 1 was attached to the package mounting base plate or heat sink 13 by a screw 15 as illustrated in FIG. 2, stresses F acted on the side surface part of the radiating base plate 1 upon tightening the screw, and the stresses were especially concentrated on a sharp corner 7 in the cut-away portion 6. In consequence, resin cracks 8 developed in that part of the resin molding member 3 which lay in contact with the side surface of the radiating base plate 1 and which was close to the corner 7 of the cut-away portion (refer to FIG. 3). Accordingly, the airtightness of the package was spoiled, and deteriorations in the characteristics of the metal-sealed semiconductor element were incurred. Particularly when the package mounting base plate 13 was not flat, this phenomenon occurred conspicuously.

BRIEF SUMMARY OF THE INVENTION

This invention has been made in order to eliminate the disadvantage of the technique described above, and has for its object to provide a packaging structure in which a plastic package is less prone to cracks etc. in a resin-molded semiconductor device.

DESCRIPTION OF THE PREFERRED EMBODIMENTS

The subject matter of this invention is that a metallic base plate having cut-away portions is employed and that the cut-away portion of the metallic base plate are provided with circular arc-shaped parts in which stresses acting on a plastic package are dispersed.

Figure 3:
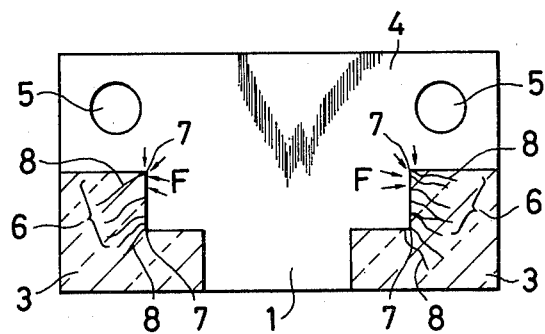
FIG. 3 is a plan view showing the states of stresses which concentrate on the corners of the cut-away portions of the header in FIG. 1 in the resin-molded semiconductor device employing this header and resin cracks which are caused by the stresses.
Figure 4:
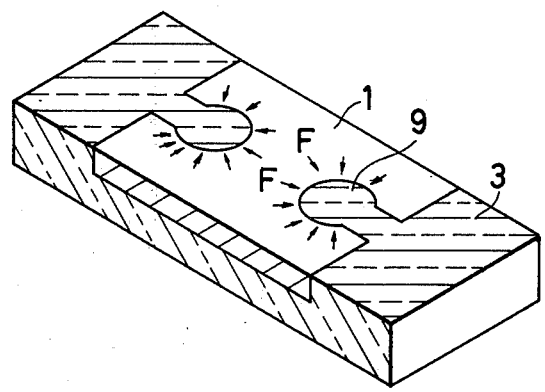
FIG. 4 is a perspective view showing the principle structure of this invention.
Figure 5:
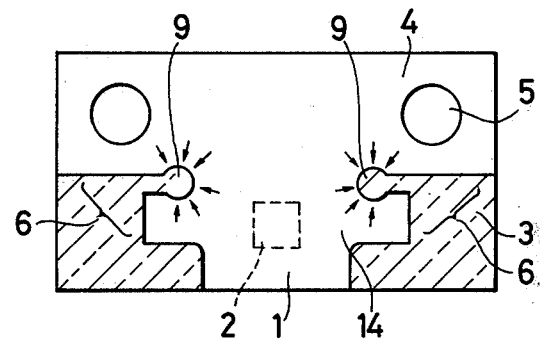
FIG. 5 is a plan view of a metal frame to which this invention is applied.
Figure 6:
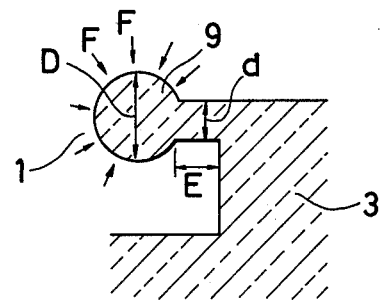
FIG. 6 is a partially enlarged view of the metal frame shown in FIG. 5.

FIG. 4 shows the principle structure of this invention. Numeral 1 designates a metallic base plate, and numeral 3 a plastic package which lies in contact with the side surfaces of the base plate. Arcuate recess portions 9 are provided in parts of the side surfaces of the metallic base plate, and stresses F to act on the plastic package from the metallic base plate are received by circular arc-shaped parts of the arcuate recess portions 9, whereby the stresses F on the plastic package 3 are dispersed so as to prevent the stress concentration from occurring. FIG. 5 shows a structure in the case where this invention is applied to the metal frame illustrated in FIG. 3. The metallic base plate 1 is made of, for example, copper (Cu), and it consists of an external connection portion 4 having screw holes 5, and an element mounting portion 14. As indicated by dotted lines in FIG. 5, a semiconductor element 2 is connected to the element mounting portion 14. The lateral width of the external connection portion 4 is greater than that of the element mounting portion 14, so that cut-away portions 6 are formed in the side surfaces of the metallic base plate 1. The cut-away portions 6 are formed with the arcuate recess portions 9. The plastic package 3 is molded in contact with the side surfaces of the recess portions 9. According to the structure as described above, the stresses F to act on the plastic package 3 can be dispersed by the arcuate recess portions 9, and resin cracks otherwise caused by the stresses F acting on the metallic (heat radiating) base plate 1 can be prevented. In such structure of this invention, the side of the plastic package 3 is adapted to receive the stresses F by the curved surface of the arcuate portion as illustrated in FIG. 6. Letting D denote the diameter of the circular arc-shaped part and d denote the width of the entrance of the arcuate portion, it is recommended to make D>d in order to secure a large contact area between the plastic package 3 and the metallic base plate 1. In a case where the distance E from a corner part to the circular arc-shaped part is made great in the cut-away portion 6, the distance from the screw hole 5 to the circular arc-shaped part increases, and hence, the stresses to act on this part can be reduced.

Figure 7:
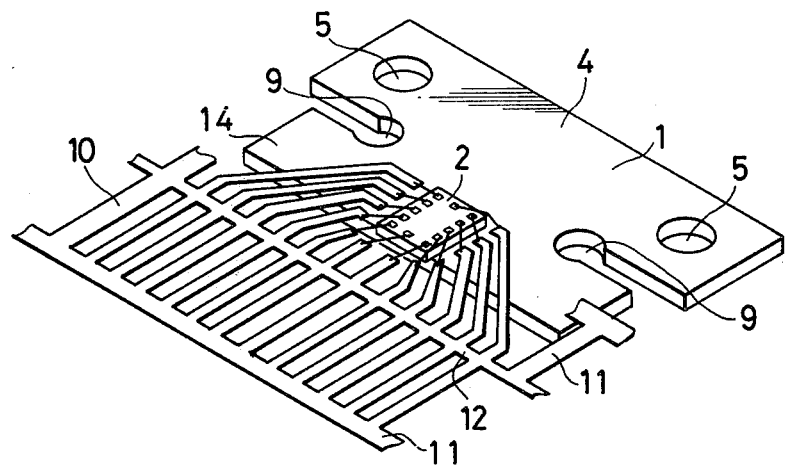
FIG. 7 is a perspective view showing the relationship among another metal frame applying this invention thereto, a lead frame and a semiconductor element.
Figure 8:
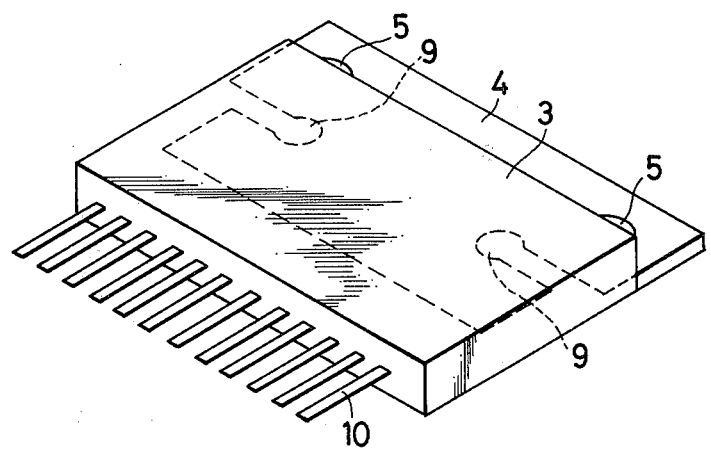
FIG. 8 is a perspective view of a resin-molded semiconductor device employing the metal frame shown in FIG. 7.

FIG. 7 shows another embodiment in the case where this invention is applied to a resin-molded power IC. It illustrates the state before resin-molding in which a lead frame 10 integrally formed with a plurality of leads has been assembled on the metallic radiating base plate 1 with the semiconductor element 2 mounted thereon. Electrodes of the semiconductor element 2 are bonded to the inner ends of the respective leads of the lead frame by means of wires of gold (Au). After the resin molding, a portion 11 connecting the leads, a dam 12 etc. are cut off. FIG. 8 illustrates the state of the IC in which the metallic base plate 1 shown in FIG. 7 has been sealed by the plastic package 3.

Figure 1:
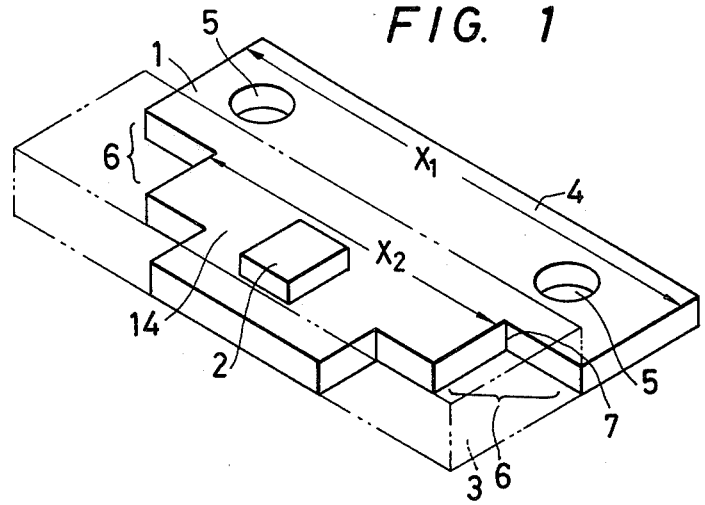
FIG. 1 is a perspective view of the header of a resin-molded semiconductor device which has been previously proposed by the inventors of the present invention.
Figure 2:
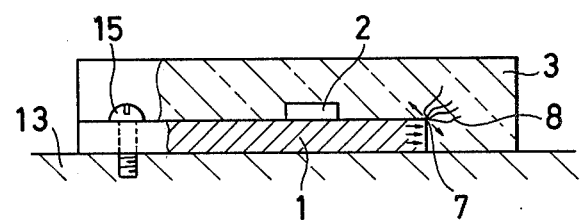
FIG. 2 is a sectional view of a cut-away portion in ths resin-molded semiconductor device employing the header in FIG. 1.

In the above semiconductor device according to this invention, the screw clamping strength=[(warp of the mounting base plate 13+warp of the metallic base plate 1)×clamping torque] was enhanced four times or more as compared with that in the semiconductor device shown in FIG. 1. In addition, the semiconductor device of this invention can achieve good characteristics of heat radiation, rigid mounting of the resin-molded semiconductor device on the mounting base plate and reduction in the amount of warp of the resin during the molding by making unequal the lateral width of the external connection portion of the metallic base plate protuberant from the plastic package and the lateral width or the element mounting portion of the metallic base plate. Therefore, various excellent effects are brought forth together with the enhancement of the screw clamping strength.

This invention is applicable to various sorts of resin-molded semiconductor devices including power ICs and power transistors.

The resin-molded semiconductor devices of the foregoing embodiments are such that, using the screw holes provided in the metallic base plate, this metallic base plate is attached to the package mounting base plate (heat sink) through the screws. This invention is also applicable in case of a resin-molded semiconductor device wherein the metallic base plate is attached to the heat sink by holding the external connection portion of the metallic base plate in the heat sink without employing the screw holes. In this way, the various effects described above can be achieved.

We claim:

1. A resin-molded semiconductor device comprising:
a metallic base plate which includes a first sheet portion having a first pair of opposing sides, said sides defining a width of said first sheet portion, and a second sheet portion extending from another side of said first sheet portion which is located in a direction which crosses said first pair of sides of said first sheet portion, said second sheet portion having a second pair of opposing sides extending in the same direction as that of said first pair of opposing sides, the width of said second portion defined by said second pair of opposing sides being less than the corresponding width of said first sheet portion, said second sheet portion adjoining in a middle part of said another side so as to be line-symmetric with respect to a straight line to said another side;
a pair of arcuate recess portions respectively provided in said first and second sheet portions in an area where said another side and the respective second sides intersect each other;
a semiconductor element fixed to said second sheet portion;
a plastic package which covers said semiconductor element and said second sheet portion, but which does not cover said first sheet portion; and
mounting means provided in said first sheet portion for mounting said first sheet portion on an external heat sink.

2. A resin-molded semiconductor device according to claim 1, wherein said mounting means comprises a pair of holes for inserting mounting screws therein, said pair of holes being respectively formed in opposite extended parts of corresponding wide portions, each of which projects more than the width of the second sheet portion.

3. A resin-molded semiconductor device comprising
a metal plate having opposite side edges, each of which is stepped so that the plate has a wider portion and a narrower portion, both portions extending from one of said side edges to the other;
a semiconductor element mounted on the said narrower portion;
means on said wider portion for securing said device to a heat sink;
a recess in each of its said sides of said plate in the region of the step in the side, each said recess having an outline, as seen in the direction perpendicular to the plate, which at leat partly consists of a curve; and
a plastic material package which covers said semiconductor element and at least part of said narrower portion of the plate, so as to protect the element and fill the recesses, but not to cover said wider portion of the plate.

4. A semiconductor device according to claim 1, or 3, wherein each said recess, as seen in the direction perpendicular to the plate, has a keyhole shape, with a circular arc portion located inwardly of the plate with respect to a shank portion which has a diameter less than said circular arc portion.

5. A semiconductor device according to claim 3, wherein a pair of holes for securing screws are respectively formed in opposite extended parts of the wider portion, each of which opposite extended parts is projected more than the corresponding width of narrower portion and forms the step.

6. A resin-molded semiconductor device comprising:
a metallic base plate which includes a first sheet portion having a first pair of opposing sides, said sides defining a width of said first sheet portion, and a second sheet portion extending from another side of said first sheet portion which is located in the direction which crosses said first pair of sides of said first sheet portion, said second sheet portion having a second pair of opposing sides extending in the same direction as that of said first pair of opposing sides, the width of said second portion defined by said second pair of opposing sides being less than the corresponding width of said first sheet portion, said second sheet portion adjoining a middle part of said another side so as to be line-symmetric with respect to a straight line to said another side;

a semiconductor element fixed to said second sheet portion;

a plastic package which covers said semiconductor element and said second sheet portion;

mounting means provided in said first sheet portion for mounting said first sheet portion on an external heat sink; and a pair of arcuate recess portions respectively provided in said first and second sheet portions in an area where said another side and the respective second sides intersect each other to reduce stress induced on said plastic package by said mounting means in said first sheet portion by dispersing said stress to said plastic package along edges of said arcuate recess portions.

7. A resin-molded semiconductor device comprising:

a metal plate having opposite side edges, each of which is stepped so that the plate has a wider portion and a narrower portion, both portions extending from one of said side edges to the other;

a semiconductor element mounted on the said narrower portion;

means on said wider portion for securing said device to a heat sink; and a plastic material package which covers said semiconductor element and at least part of said narrower portion of the plate, so as to protect the element, wherein said plate has a recess in each of its said sides in the region of the step in the side, each said recess having an outline, as seen in the direction perpendicular to the plate, which at least partly consists of a curve, to reduce stress induced on said plastic package by said securing means in said wider portion by dispersing said stress to said plastic package along edges of said curve.

* * * * *